United States Patent [19]

Preuss et al.

[11] Patent Number: 5,319,735
[45] Date of Patent: Jun. 7, 1994

[54] EMBEDDED SIGNALLING

[75] Inventors: Robert D. Preuss, Boston, Mass.; Salim E. Roukos, Scarsdale, N.Y.; A. W. F. Huggins, Arlington, Mass.; Herbert Gish, Newton, Mass.; Marcos A. Bergamo, Wellesley, Mass.; Patrick M. Peterson, Cambridge, Mass.; Alan G. Derr, Westford, Mass.

[73] Assignee: Bolt Beranek and Newman Inc., Cambridge, Mass.

[21] Appl. No.: 808,913

[22] Filed: Dec. 17, 1991

[51] Int. Cl.$^5$ .............................................. G10L 3/00
[52] U.S. Cl. .................................................... 395/2.14
[58] Field of Search .............. 375/1, 122; 358/143; 370/110.1; 395/2, 2.1, 2.14; 381/29-40

[56] References Cited

U.S. PATENT DOCUMENTS

| | | | |
|---|---|---|---|
| 3,004,104 | 10/1961 | Hembrooke | 370/37 |
| 4,395,600 | 7/1983 | Lundy et al. | 381/73.1 |
| 4,425,661 | 1/1984 | Moses et al. | 375/1 |
| 4,593,389 | 6/1986 | Wurzburg et al. | 370/110.1 |
| 4,775,901 | 10/1988 | Nakano | 360/60 |
| 4,777,529 | 10/1988 | Schultz et al. | 358/143 |
| 4,903,301 | 2/1990 | Kondo et al. | 381/30 |
| 4,943,973 | 7/1990 | Werner | 375/1 |
| 4,965,680 | 10/1990 | Endoh | 360/60 |
| 4,972,471 | 11/1990 | Gross et al. | 380/3 |
| 4,979,210 | 12/1990 | Nagata et al. | 380/3 |
| 5,212,551 | 5/1993 | Conanan | 358/143 |

*Primary Examiner*—David D. Knepper
*Attorney, Agent, or Firm*—Henry D. Pahl, Jr.

[57] ABSTRACT

A code signal representing a sequence of code symbols carrying digital information is generated with the frequency components of the code signal being essentially confined to a preselected signalling band lying within the bandwidth of an audio signal within which the code signal is to be embedded. The audio signal is continuously frequency analyzed over a frequency band encompassing the signalling band and the code signal is dynamically filtered as a function of the analysis thereby to provide a modified code signal with frequency components which are, at each time instant, essentially a preselected small proportion of the levels of the corresponding audio signal frequency components. Accordingly, the modified code signal can be combined with the audio signal to obtain a composite audio signal which is not readily distinguishable from the original audio signal by listening. Furthermore, the digital information can be recovered from the composite audio signal by a procedure which is essentially the compliment of that used to obtain the composite audio signal.

25 Claims, 11 Drawing Sheets

Top Level Block Diagram of Information Embedding Process.

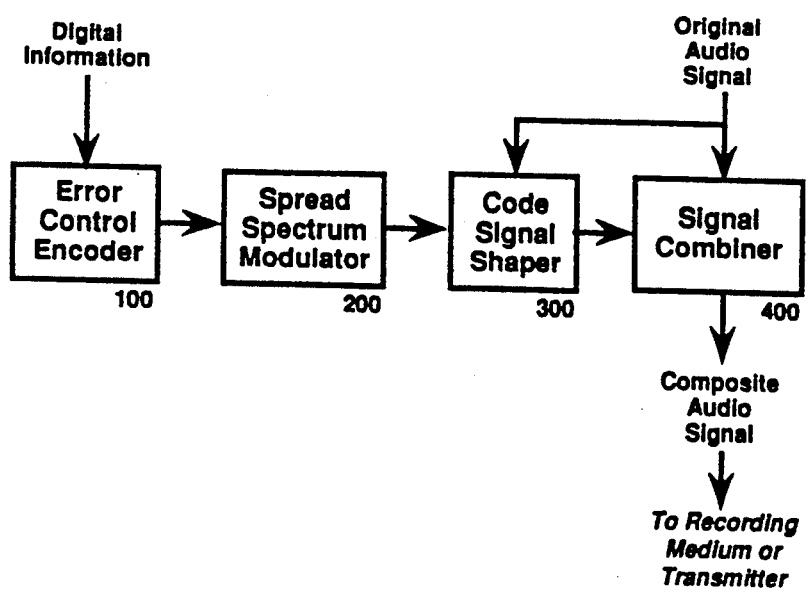
Figure 1. Top Level Block Diagram of Information Embedding Process.

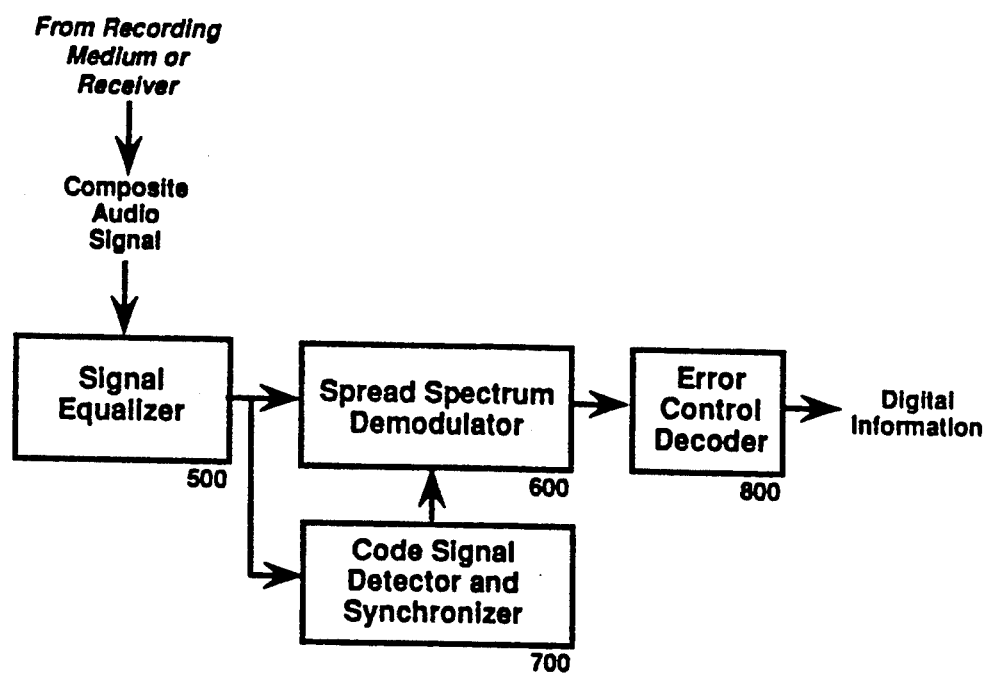
Figure 2. Top Level Block Diagram of Information Recovery Process.

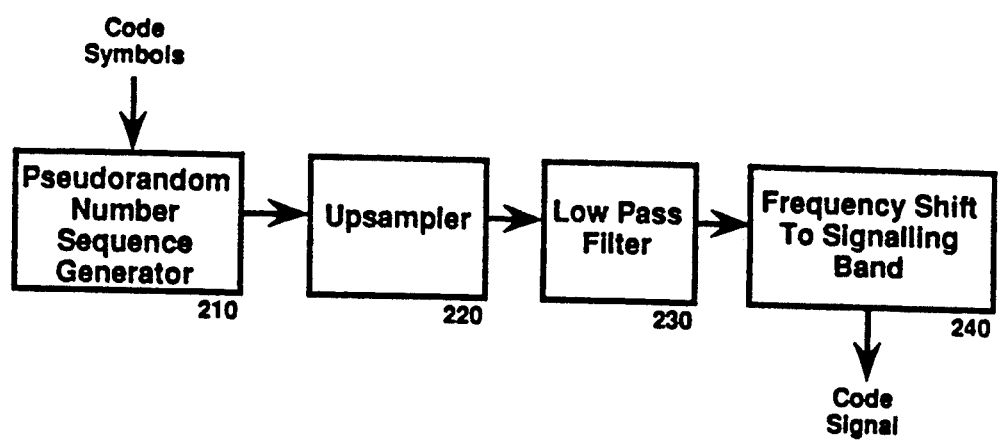
Figure 3. Block Diagram of Spread Spectrum Modulator 200.

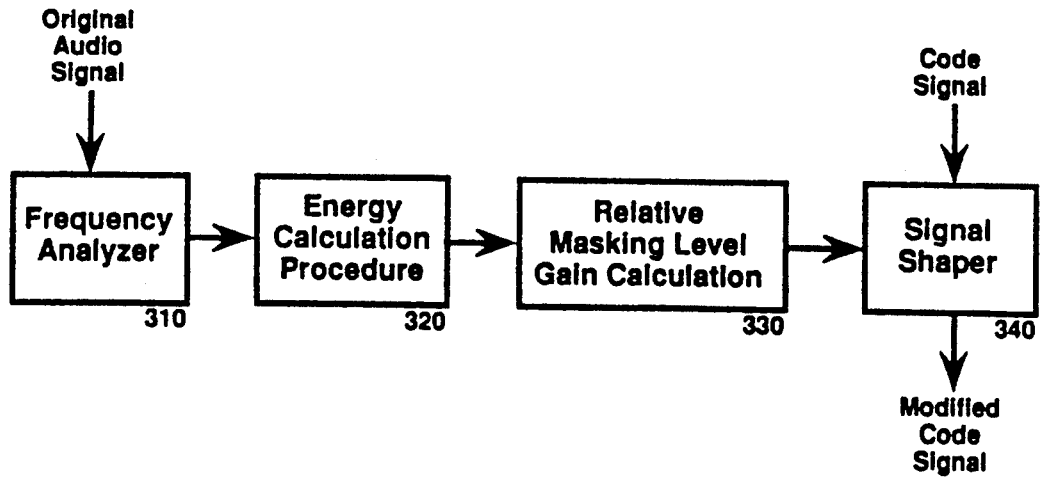
Figure 4. Block Diagram of Code Signal Shaper 300.

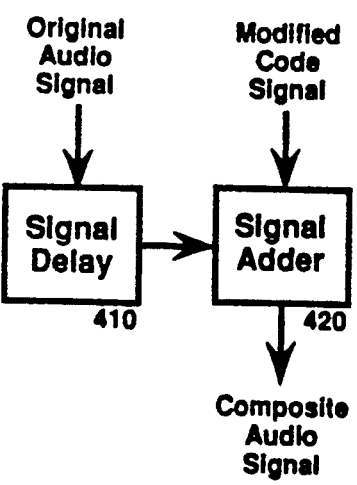
Figure 5. Block Diagram of Signal Combiner 400.

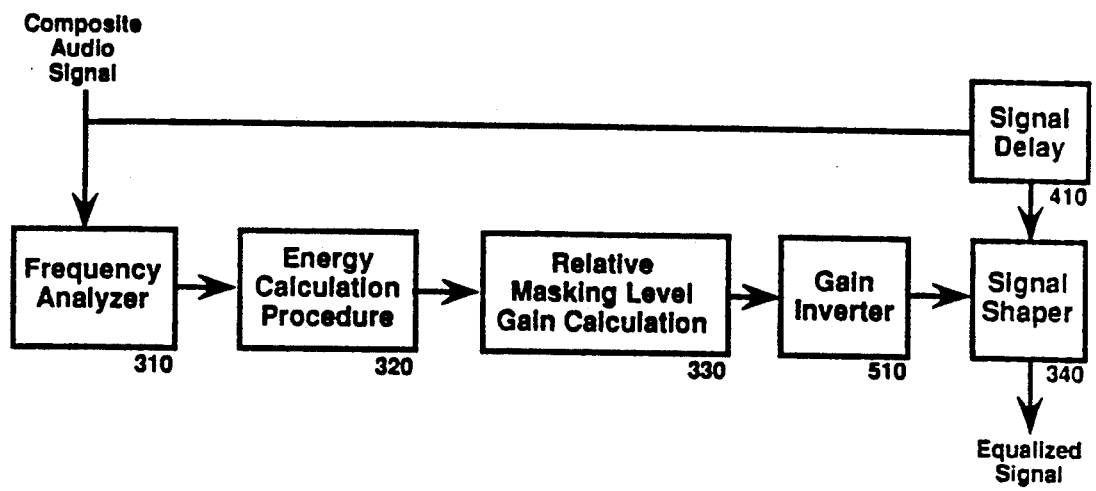
Figure 6. Block Diagram of Signal Equalizer 500.

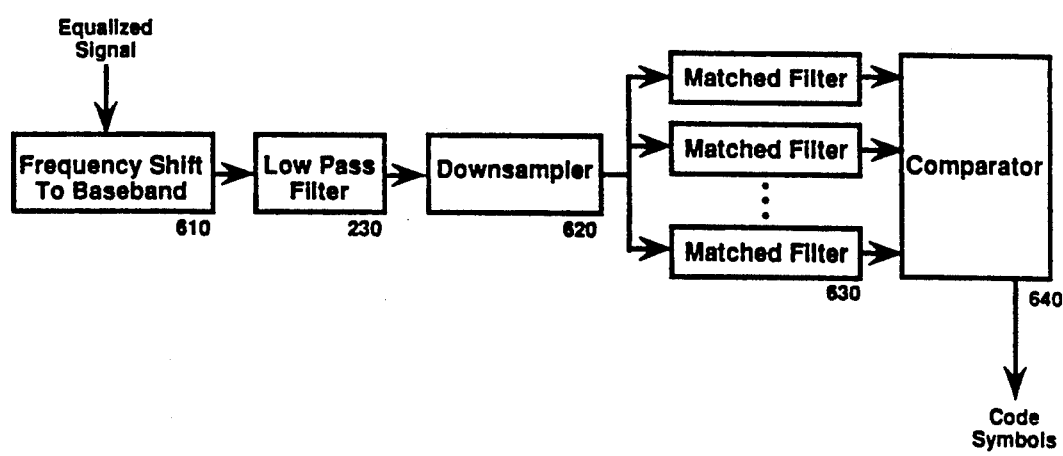
Figure 7. Block Diagram of Spread Spectrum Demodulator 600.

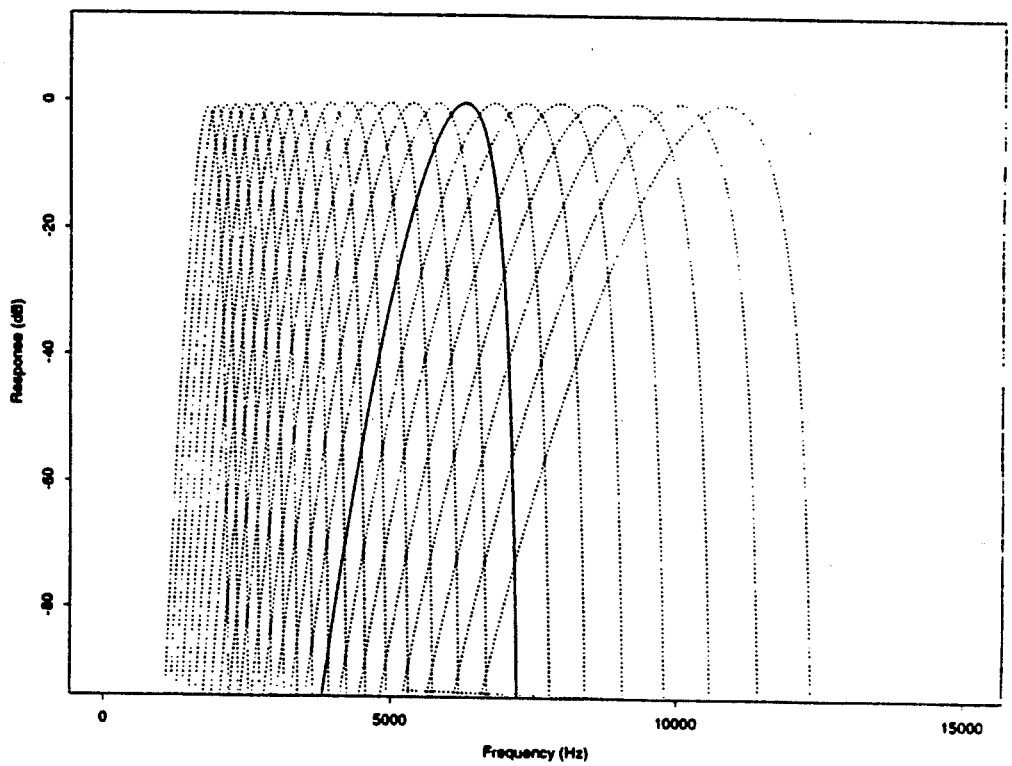
Figure 8. Frequency Response of a Bank of Bandpass Filters Employed for Frequency Analysis.

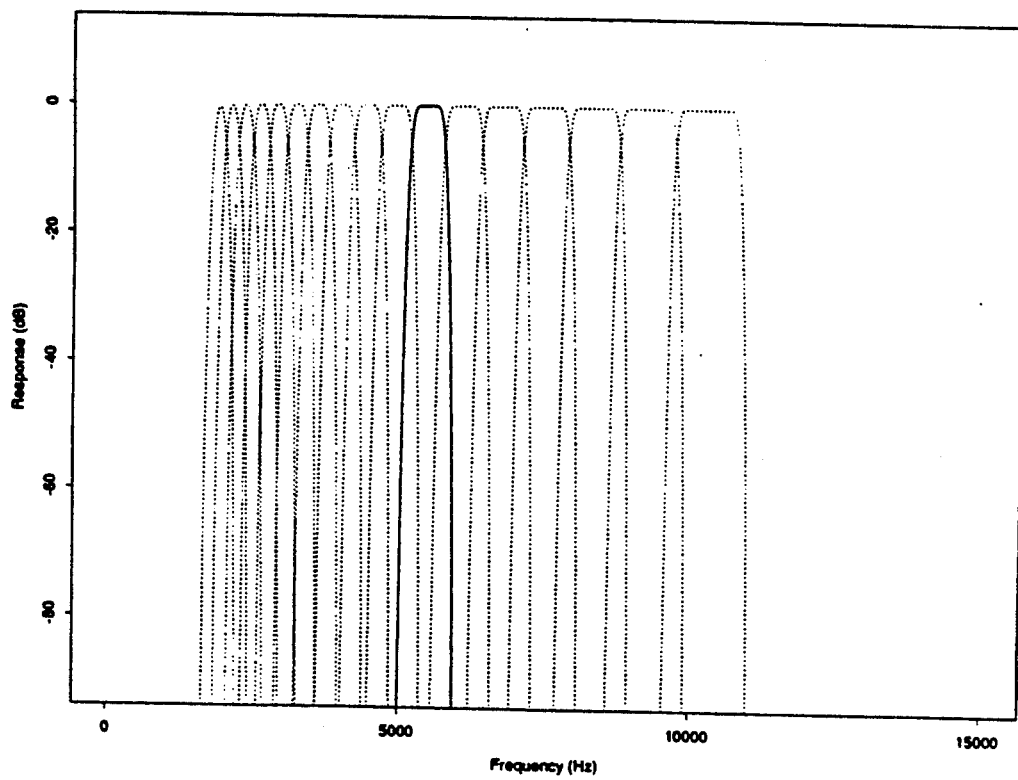
Figure 9. Frequency Response of a Bank of Bandpass Filters Employed for Signal Shaping.

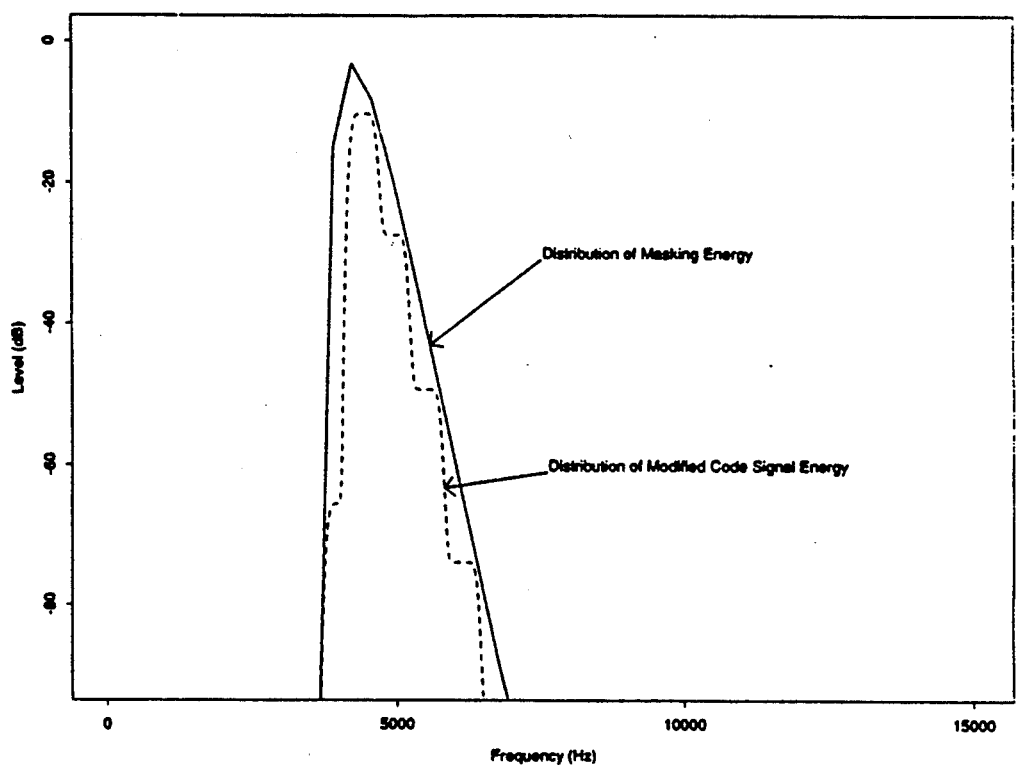
Figure 10. Distribution of Masking and Modified Code Signal Energy in the case that the Original Audio Signal is a Tone.

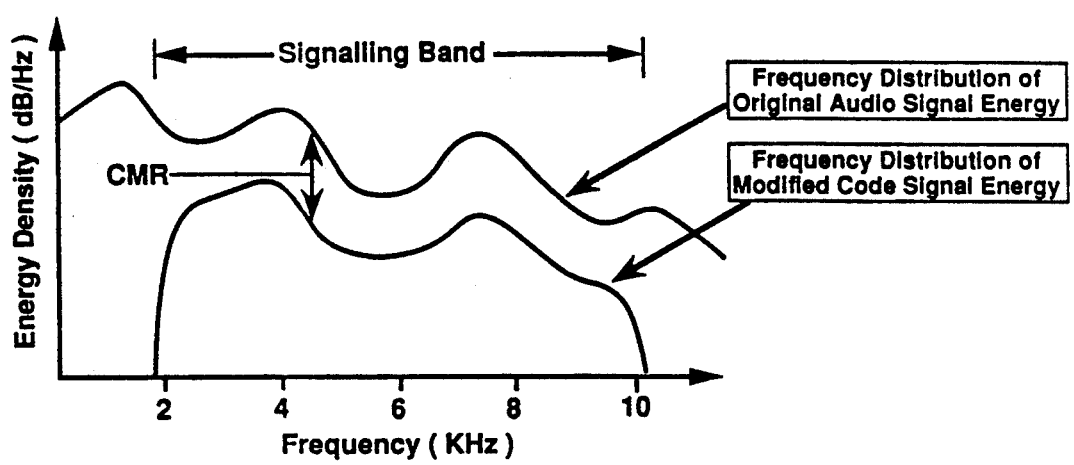
Figure 11. Relationship Between Original Audio Signal and Modified Code Signal.

EMBEDDED SIGNALLING

BACKGROUND OF THE INVENTION

The present invention relates to an-embedded signalling system and more particularly, to a system for embedding a code signal in an audio signal in a manner such that the composite signal is not readily distinguishable from the original audio signal by listening and in a manner such that the code signal cannot be readily removed or obscured without simultaneously degrading the quality of the audio signal.

There are numerous reasons for providing a system or means for readily identifying the source of an audio signal. In the music and recording industries in particular, such a system is desired for automatic broadcast performance accounting and auditing of air play to assist with market planning for auditing released product from licensed tracks to confirm their source for administrative control of music tracks in studio and manufacturing operations for determining the source of unauthorized master release for auditing electronic delivery channels to establish proper royalty payment for proof of original track where a sound-alike is claimed for detecting sampled music tracks which are incorporated in new sound recordings for controlling authorization to copy for identifying copyright infringement by direct copying and for automatically cataloging the contents of an audio library.

As will be understood, it is highly desirable that the identifying information utilized by such a system not be easily deleted or obscured, e.g., by the adding in of additional audio material or by the re-recording of the material onto a different media. Systems that rely on a proprietary adaptation of the digital format used for recording audio signals in various high quality media such as compact discs and digital audio tape (DAT) are subject to such problems since once the original digital recording is converted to analog form, the identifying information is typically lost or no longer recoverable.

While it is thus desirable that the identifying information be permanently and inseparably intertwined with the original audio signal, it is also important that the presence of the code signal representing this information not interfere with the usual intended use of the audio signal, e.g., by not degrading the quality of an audio signal intended for entertainment.

Among the several objects in the present invention, it may be noted the provision of a novel method for embedding code symbols in an audio signal; the provision of such a method which results in a composite audio signal which is not readily distinguishable from the original by listening; the provision of such a method in which the composite audio signal is not readily modifiable so as to obscure or eliminate the code symbols without simultaneously degrading the quality of the audio signal; the provision of such a method in which the code symbols may be reliably extracted from the composite audio signal and the provision of such a method which may be implemented relatively simply and inexpensively. Other objects and features will be in part apparent and in part pointed out hereinafter.

SUMMARY OF THE INVENTION

In the method of the present invention, digital information is encoded to produce a sequence of code symbols. This sequence of code symbols is embedded in an audio signal by generating a corresponding code signal representing the sequence of code symbols, the frequency components of the code signal being essentially confined to a preselected signalling band lying within the bandwidth of the audio signal and successive segments of the code signal corresponding to successive code symbols in the sequence. The audio signal is continuously frequency analyzed over a frequency band encompassing the signalling band and the code signal is dynamically filtered as a function of the analysis thereby to provide a modified code signal with frequency component levels which are, at each time instant, essentially a preselected proportion of the levels of the audio signal frequency components in corresponding frequency ranges. The modified code signal and the audio signal are combined to provide a composite audio signal in which the digital information is embedded. This composite audio signal is then recorded on a recording medium or is otherwise subjected to a transmission channel.

In accordance with another aspect of the invention, the digital information is recovered from the composite audio signal through a procedure which is essentially converse to the embedding process. The composite audio signal is continuously frequency analyzed over a frequency band encompassing the signalling band and is dynamically filtered as a function of the analysis thereby to provide an equalized signal with frequency component levels which are, at each time instant, essentially uniform throughout the signalling band and, preferably, essentially nil at frequencies outside the signalling band. In accordance with other aspects of the invention, a synchronization procedure detects the presence of the code signal in the equalized signal and locates the successive code signal segments. A matched filtering procedure then identifies the successive code signal segments thereby extracting the respective sequence of code symbols. The digital information is then recovered from this sequence of code symbols.

BRIEF DESCRIPTION OF THE DRAWINGS

FIG. 1 is a top level block diagram of apparatus for embedding digital information in an audio signal in accordance with the method of the present invention.

FIG. 2 is a top level block diagram of apparatus for recovering the digital information from a composite audio signal in accordance with the method of the present invention.

FIG. 3 is a block diagram of apparatus implementing the spread spectrum modulator function shown in FIG. 1.

FIG. 4 is a block diagram of apparatus implementing the code signal shaper function shown in FIG. 1.

FIG. 5 is a block diagram of apparatus implementing the signal combiner function shown in FIG. 1.

FIG. 6 is a block diagram of apparatus implementing the signal equalizer function shown in FIG. 2.

FIG. 7 is a block diagram of apparatus implementing the spread spectrum demodulator function shown in FIG. 2.

FIG. 8 illustrates the frequency response of a bank of bandpass filters employed for frequency analysis.

FIG. 9 illustrates the frequency response of a bank of bandpass filters employed for signal shaping.

FIG. 10 illustrates the distribution of masking and modified code signal energy as calculated in the case that the original audio signal is a tone.

FIG. 11 illustrates the relationship between the frequency distributions of the original audio signal and the modified code signal.

Corresponding reference characters indicate corresponding parts throughout the several views of the drawings.

DESCRIPTION OF THE PREFERRED EMBODIMENT

In the particular embodiment of the method of the present invention described herein by way of illustration, the digital information to be signalled is transformed by means of a process which may be described as a spread spectrum technique into a modified code signal representing this digital information in such a way that the modified code signal can be combined with the original audio signal to form a composite audio signal which is not readily distinguishable from the original audio signal by listening. In particular, the digital information is represented by a sequence of code symbols and each code symbol, in turn, is represented by a pseudorandom number sequence which is filtered and dynamically modified in accordance with the method of the present invention and which is then detectable by means of a matched filter.

The composite audio signal can then be recorded or otherwise subjected to a transmission channel which may distort and/or modify the composite audio signal. The digital information can be then recovered from this distorted and/or modified composite audio signal by means of a method which is in many ways a compliment or converse of the method for producing the composite audio signal. The recovered digital information will be very reliable in the case that such distortions and/or modifications do not degrade the quality of the composite audio signal.

While many of the various processing steps to be described might also be performed by analog circuitry, it is presently preferred that essentially all of these steps be performed by digital techniques such as those conventionally implemented in special purpose digital signal processing integrated circuits or high speed micro computers. Thus, though the various components or steps of the method of the present invention are represented by separate blocks in the diagrams of FIGS. 1 and 2, for example, these steps are in fact preferably implemented by suitable programming of a digital processor.

Referring now to FIG. 1, a sequence of code symbols to be embedded in an audio signal is derived as the output of an Error Control Encoder 100. The particular embodiment described herein employs an error control encoder, known by those skilled in the art as a Reed-Solomon encoder, which produces a block of n code symbols for each block of k information symbols input. For example, the information symbols may comprise the artist's name and the title of a musical selection. These information and code symbols are drawn from a common alphabet of 256 symbols so that each information symbol represents 8 bits of information or one ASCII character. Values of k=32 and n=51 are appropriate to the particular embodiment being described. This use of an error control encoder in conjunction with the method of the present invention is a well understood means for improving the reliability of infomation retrieval. In particular, the k information symbols can be retrieved from the n code symbols by means of a Reed-Solomon decoder in the case that some of the n code symbols are in error or are erased. The particular embodiment of the Error Control Encoder 100 described herein further produces a sequence of m special code symbols drawn from a distinct alphabet immediately prior to producing each block of n code symbols output from the Reed-Solomon encoder. These special code symbols are drawn from a special alphabet of 2 symbols so that all code symbols are drawn from a combined alphabet of 256+2=258 symbols. A value of m=13 is appropriate to the particular embodiment being described. This introduction of special code symbols is a simple means for reducing the complexity of the Code Signal Detector & Synchronizer function shown as block 700 in FIG. 2. Each group of m special code symbols followed by n code symbols output from the Reed-Solomon encoder is conveniently designated a message block.

The resulting sequence of code symbols is further encoded by means of a Spread Spectra Modulator 200 to produce a code signal which represents the sequence of code symbols. In particular, each code symbol is represented by a corresponding pseudorandom number sequence which is filtered and modified in accordance with the method of the present invention. As a consequence, successive code signal segments correspond to successive code symbols which are then detectable and distinguishability by means of a matched filter.

The code signal is then modified by means of a Code Signal Shamer 300 to produce a modified code signal with frequency component levels which are, at each time instant, essentially a preselected proportion of the levels of the audio signal frequency components in the corresponding frequency range. The dynamically modified code signal is then combined with the original audio signal by means of a Signal Combiner 400 to produce a composite audio signal.

The composite audio signal is then recorded on a recording medium such as a DAT or is otherwise subjected to a transmission channel which may or may not involve a significant distortion and/or further modification of the composite audio signal. As indicated previously, it is a desired attribute of the method of the present invention that the identifying information be reliably recoverable from the composite audio signal after such distortions and/or further modifications in the case that such distortions and/or modifications do not significantly degrade the quality of the composite audio signal.

Referring now to FIG. 2, the composite audio signal is, during reception or playback from a recording medium, transformed into an equalized signal by means of a Signal Equalizer 500 which performs a function which is essentially the compliment or converse of the function performed by the Code Signal Shaper 300. The presence of the code signal in the equalized signal is detected by means of a Code Signal Detector & Synchronizer 700 which also determines the requisite initial timing information which locates the successive code signal segments corresponding to successive code symbols.

The sequence of code symbols is recovered by means of a Spread Spectrum Demodulator 600 which performs a function which is essentially the compliment of the function performed by the Spread Spectrum Modulator 200. The synchronizer provides the initial timing information needed for this function.

The signalled digital information is then recovered from the sequence of code symbols by means of an Error Control Decoder 800 which performs a function which is essentially the compliment of the function performed by the Error Control Encoder 100. The particular embodiment described herein employs an error control decoder, known by those skilled in the art as an algebraic Reed-Solomon decoder, which is capable of correcting code symbol erasures as well as code symbol errors.

Referring now to FIG. 3, each possible input code symbol uniquely corresponds to a particular pseudorandom number sequence. The collection of pseudorandom number sequences is explicitly stored in a lookup table so that each successive input code symbol simply selects the corresponding pseudorandom number sequence which is then produced in block 210 by fetching this pseudorandom number sequence from the lookup table. In an alternative embodiment, a special purpose circuit may be designed to dynamically produce in block 210 the pseudorandom number sequences corresponding to successive input code symbols.

The numbers within these pseudorandom sequences are conventionally referred to in the art as "chips" and the sequences themselves are conventionally referred to as "chip sequences". The code symbols are encoded at a rate of $8820 \div 2040$ code symbols per second and each is represented by a sequence of 2040 chips so that the chips are produced at a rate of 8020 chips per second. This process generates as the output from block 210 a digital signal representing frequency components up to $8820 \div 2 = 4410$ Hz in the example being disclosed.

This digital signal is then upsampled to a higher clock frequency in block 220 by inserting a sequence of digital zeros between successive chips and the resulting higher rate digital signal is low pass filtered in block 230 to eliminate extraneous high frequency components which exist as a consequence of inserting the digital zeros. This process generates a baseband code signal. In the example being disclosed, four digital zeros are inserted between successive chips and the low pass filter has a cutoff frequency of 4410 Hz so that the baseband signal is a digital signal based on a clock frequency of $8820 \times 5 = 44100$ Hz representing frequency components up to 4410 Hz.

The baseband signal is then frequency shifted in block 240 to a signalling band which lies entirely within the bandwidth of the audio signal. This process generates the code signal. In the particular embodiment illustrated the signalling band comprises the range from 1890 Hz to 10710 Hz.

Referring now to FIG. 4, the original audio signal into which the code signal is to be embedded, e.g. the music, is continuously frequency analyzed in block 310 over a frequency band which encompasses the signalling band. The result of this analysis is employed in block 320 to calculate the frequency distribution of the audio signal masking energy as it continuously evolves in time. Basically, the analysis is performed over a range of frequencies which would have substantial masking effect within the signalling band and is realized in the example being given by means of a bank of bandpass filters.

FIG. 8 illustrates the frequency response characteristics of the bank of bandpass filters employed by the particular embodiment being described. As is understood by those skilled in the art, the ability of one sound to mask or conceal another is dependant not only upon relative amplitudes but also upon closeness in frequency. In particular, the frequency distribution of masking energy produced by a tone is known to extend to frequencies above the tone more than to frequencies below the tone. This asymmetric frequency dependance is reflected in the asynthetic frequency response characteristics illustrated in FIG. 8. In particular, the frequency response of each bandpass filter extends to frequencies below the peak response frequency more than to frequencies above the peak response frequency.

At each time instant, the frequency distribution of audio signal masking energy determines a corresponding frequency distribution of code signal energy that will be masked by the presence of the audio signal. This frequency distribution of code signal energy is represented by a set of gain values, calculated in block 330, wherein each gain value corresponds to a distinct frequency range within the signalling band.

The code signal is then selectively filtered in block 340 to decompose the code signal into component signals which occupy only these distinct frequency ranges. This selective filtering is realized in the example being given by means of a bank of bandpass filters. FIG. 9 illustrates the frequency response characteristics of the bank of bandpass filters employed by the particular embodiment being described.

The gain values calculated in block 330 are then applied in block 340 to adjust the levels of the corresponding component signals and these adjusted signals are combined to produce the modified code signal. Because each gain value has been determined so as to ensure that the corresponding frequency distribution of adjusted signal energy will not exceed the frequency distribution of masking energy and because distinct adjusted signals have significant energy only within essentially nonoverlapping frequency ranges, the frequency distribution of modified code signal energy will not exceed the frequency distribution of masking energy.

FIG. 10 illustrates the result of this procedure in the case that the audio signal is a 4240 Hz tone. In this figure, the frequency distribution of masking energy is seen to extend to frequencies above the tone more than to frequencies below the tone and the frequency distribution of modified code signal energy is seen to lie below the frequency distribution of masking energy.

The overall effect of this procedure is to produce a dynamically modified code signal with frequency component levels which are, at each time instant, essentially a preselected proportion of the levels of the audio signal frequency components in the corresponding frequency range. This overall effect is illustrated in FIG. 11 where it may be seen that, within the signalling band, the frequency distribution of modified code signal energy essentially parallels the frequency distribution of audio signal energy with a fixed offset over the signalling band. The offset, measured in decibel (dB) units, is conveniently designated the code to music ratio (CMR).

Referring now to FIG. 5, block 410 delays the original audio signal to compensate for the delays introduced by the various processing steps of block 300. This compensating delay temporally aligns the original audio signal with the modified code signal so that psychoacoustic masking effects are used to maximum advantage when these two signals are added or combined in block 420 to form the composite audio signal.

The composite audio signal is then recorded on a recording medium such as a OAT or is otherwise subjected to a transmission channel which may or may not involve a significant distortion and/or further modification of the composite audio signal. As indicated previously, it is a desired attribute of the method of the present invention that the identifying information be reliably recoverable from the composite audio signal after such distortions and/or further modifications in the case that such distortions and/or modifications do not significantly degrade the quality of the composite audio signal.

Referring now to FIG. 6, it is seen that in many ways this Signal Equalizer 500 is a compliment or converse of the Code Signal Shaper 300 shown in FIG. 4. In the particular embodiment described herein the processing steps indicated by blocks 310, 320, 330, 340 and 410 are identical to those corresponding processing steps indicated by the same block numbers in FIGS. 4 and 5. Again, the various processing steps will introduce delays and a compensating delay is introduced, as indicated at block 410, to temporally align the composite audio signal with the continuously evolving set of gain values output from block 330.

In contrast to FIG. 4, the input signal for FIG. 6 is the composite audio signal after all distortions and/or modifications, if any, which may be introduced by transmission or recording rather than the original audio signal. Consequently, the continuously evolving set of gain values output from block 330 will in general differ in FIG. 6 from those in FIG. 4. However, in the case that the composite audio signal has not been significantly distorted and/or modified, these gain values will not differ substantially because the CMR offset is selected to ensure that the frequency distribution of composite audio signal energy produced by the embedding process does not differ substantially from the frequency distribution of original audio signal energy.

In that this Signal Equalizer 500 function is intended to compliment the Code Signal Shaper 300 function it is necessary that each individual gain value output at block 330 be inverted, as indicated in block 510, before being applied in block 340. As will be understood, this gain inversion has the consequent effect that the equalized signal output from block 340 will contain an essentially even energy distribution over the signalling band. Moreover, as seen in FIG. 9, the composite frequency response of the bank of bandpass filters employed in block 340 is essentially nil outside the signalling band and, as a consequence, the equalized signal is essentially nil outside the signalling band.

Referring now to FIG. 7, it is seen that in many ways this Spread Spectrum Demodulator 600 is a compliment or converse of the Spread Spectrum Modulator 200 shown in FIG. 3. The equalized signal is frequency shifted to baseband at block 610 in a process that is essentially complimentary to that of block 240. The result is then lowpass filtered at block 230 in a processing step which, in the particular embodiment being described, is essentially identical to the corresponding processing step indicated by the same block number in FIG. 3. This produces a received baseband signal output from block 230. In the example being disclosed this received baseband signal represents frequency components up to 4410 Hz.

This received baseband signal is then downsampled at block 620 to the "chip rate" which, in the particular example being described, is based on a clock frequency of 4410×2=8820 Hz. This downsampling produces a received digital signal which is then processed by a bank of matched filters at block 630. The matched filter output values are sampled and compared at block 640 after each symbol time which, in the example being described, occurs after every 2040 chips.

As will be understood by those skilled in the art, each matched filter corresponds to one of the chip sequences produced at block 210 in FIG. 3 which, in turn, corresponds to one of the code symbols in the alphabet. Accordingly, for a given transmitted code symbol, the corresponding matched filter is expected to produce a substantially greater output value than the other matched filters so that the transmitted code symbol can be identified at block 640 by comparing the matched filter output values.

The basic figure of merit for the overall system, which determines the reliability with which code symbols are identified by the above procedure, can be described by the signalling equation:

$$SE = CMR + PG - DL.$$

Here the signal excess (SE) is the figure of merit which equals the code to music ratio (CMR) plus the processing gain (PG) and minus a decoding loss (DL) where each quantity is expressed in decibel (dB) units. A larger signal excess implies a greater expected difference between the output value of the matched filter corresponding to the transmitted code symbol and the output values of the other matched filters. Accordingly, a larger signal excess further implies greater reliability in identifying code symbols.

As indicated previously, the CMR is an essentially preselected value which determines the ability to distinguish the composite audio signal from the original audio signal by listening. A conservative nominal design value for the CMR is $-19$ dB which renders the composite audio signal essentially indistinguishable from the original audio signal by listening.

As is understood by those skilled in the art, the processing gain (PG) of a matched filter increases with the length of the associated chip sequence. In the example being described the chip sequences each have a length of 2040 chips which corresponds to a processing gain of about $+36$ dB.

The decoding loss (DL) is a metric which reflects the losses and distortions in the channel, i.e. the recording media or transmission channel, and also various imperfections in the system which degrade performance. Ideally DL would have a value of 0 dB resulting in a signal excess of $+17$ dB in the particular example being disclosed.

Processing gain (PG) and decoding loss (DL) will be essentially constant in a given situation and it is an advantage of the present invention that code to music ratio (CMR) is also essentially constant due to the frequency analysis and shaping of the code signal such that the modified code signal power spectrum reflects the original audio signal power spectrum within the signalling band. Accordingly, the signal excess (SE) and the consequent signalling reliability is essentially constant between loud and soft passages, provided only that there is some minimal level of available masking energy throughout the signalling band of the original audio signal.

As will be understood from the foregoing discussion, the matched filter yielding the largest output value corresponds to the code symbol which most likely was transmitted and the magnitude of this largest output value indicates the reliability to be associated with accepting this code symbol as the recovered code symbol. Accordingly, block 640 further compares this magnitude to a threshold and, rather than risk an erroneous decision, declares the symbol "erased" if the magnitude falls below the threshold. Consequently, the sequence output from block 640 may include "erased" symbols as well as code symbols.

Decoding reliability may be further enhanced in an alternative embodiment by compensating for temporal irregularities that may be introduced by recording devices or transmission channels. These temporal irregularities may generally be viewed as a local time scale compression or expansion as may be produced, e.g., by an irregular motor speed in a tape recording or playback device. One potential compensation mechanism is essentially similar in principle to a device known by those skilled in the art as a "phase locked loop". Such a compensation mechanism could be implemented in FIG. 7 by means of a phase track estimator which would employ the matched filter output values available in block 640 to compute a phase correction estimate and to adjust the frequency shift at block 610 and the downsampler at block 620.

The Code Signal Detector & Synchronizer 700 is essentially similar to the Spread Spectrum Demodulator 600. The key difference is that the Code Signal Detector & Synchronizer must search over an appropriate range of possible code signal time alignments in order to locate the proper chip and symbol sampling times as well as the message block boundaries while the Spread Spectrum Demodulator need only keep track of a previously established time alignment. To minimize the complexity of this search, only those matched filters corresponding to the special code symbols periodically inserted into the sequence of code symbols by the Error Control Encoder 100 are implemented. Accordingly, the matched filter output values are expected to exceed the acceptance threshold only when one of these special code symbols is present. Such matched filter output values thus indicate the presence of an embedded code signal and locate the message block boundaries. Once the presence of an embedded code signal is thus detected, the chip and symbol sampling times maximizing these matched filter output values are used to initialize the Spread Spectrum Demodulator function.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying figures shall be interpreted as illustrative and not in a limiting sense.

What is claimed is:

1. A method of embedding a sequence of code symbols in an audio signal, said method comprising:
    generating a code signal representing the sequence of code symbols and with frequency components essentially confined to a preselected signalling band lying within the bandwidth of said audio signal;
    continuously frequency analyzing said audio signal over a frequency band encompassing said signalling band;
    dynamically filtering said code signal as a function of said analysis thereby to provide a modified code signal with frequency component levels which, at each time instant, are essentially negligibly small outside said signalling band and, at each frequency within said signalling band, are essentially a preselected proportion of the levels of the audio signal frequency components in a corresponding frequency range; and
    combining said modified code signal with said audio signal thereby to provide a composite audio signal.

2. The method as set forth in claim 1 wherein said code signal is generated by generating a corresponding pseudorandom number sequence for each symbol input; upsampling and lowpass filtering said sequences; and transposing upwards in frequency the filtered sequence.

3. A method of detecting a sequence of predetermined code symbols which is represented by a code signal embedded in a composite audio signal, said method comprising:
    continuously frequency analyzing said composite audio signal over a frequency band encompassing a preselected signalling band lying within the bandwidth of said composite audio signal;
    within said signalling band, filtering said composite audio signal as a converse function of the analysis thereby to provide an essentially even energy distribution over said signalling band; and
    applying said filtered signal to a set of filters, each filter in said set being matched to one of said code symbols.

4. A method of transmitting a sequence of code symbols over a channel carrying an audio signal, said method comprising:
    generating a code signal representing the sequence of code symbols and with frequency components essentially confined to a preselected signalling band lying within the bandwidth of said audio signal;
    continuously frequency analyzing said audio signal over a frequency band encompassing said signalling band;
    dynamically filtering said code signal as a function of said analysis thereby to provide a modified code signal with frequency component levels which are, at each time instant, essentially negligibly small outside said signalling band and, at each frequency within said signalling band, essentially a preselected proportion of the levels of the audio signal frequency components in a corresponding frequency range;
    combining said modified code signal with said audio signal thereby to provide a composite audio signal and transmitting said composite audio signal over said channel;
    continuously frequency analyzing the received composite audio signal over a frequency band encompassing said preselected signalling band;
    within said signalling band, filtering said received composite audio signal as a converse function of the analysis thereby to provide an essentially even energy distribution over said signalling band; and
    applying said filtered signal to a set of filters, each filter in said set being matched to one of the code symbols.

5. The method as set forth in claim 4 wherein said code signal is generated by generating a corresponding pseudorandom number sequence for each symbol input;

upsampling and lowpass filtering said sequence; and transposing upwards in frequency the filtered sequence.

6. The method as set forth in claim 4 wherein said audio signal has a bandwidth in the order of about 20 k Hz and said signalling band has a bandwidth of about 8800 Hz.

7. The method as set forth in claim 6 wherein said signalling band is centered on a frequency of about 6300 Hz.

8. The method as set forth in claim 7 wherein said symbols are sequentially encoded in said code signal at a rate of about 4.3 symbols per second.

9. The method as set forth in claim 4 wherein said preselected proportion represents a modified code signal level which is about 19 dB below the level of the audio signal.

10. A method of embedding a sequence of code symbols in an audio signal, said method comprising:
   for each symbol input, generating a corresponding pseudorandom sequence representing the respective symbol;
   upsampling, filtering and transposing said code sequences thereby to generate a code signal having frequency components essentially confined to a preselected signalling band lying within the bandwidth of said audio signal;
   continuously frequency analyzing said audio signal over a frequency band encompassing said signalling band;
   dynamically filtering said code signal as a function of said analysis thereby to provide a modified code signal with frequency component levels which are at each time instant essentially a preselected proportion of the levels of the audio signal frequency components in a corresponding frequency range;
   combining said modified code signal with said audio signal thereby to provide a composite audio signal.

11. A method of transmitting a sequence of code symbols selectable from a predetermined alphabet and occurring at a rate of about 4.3 per second over a channel carrying an audio signal having a bandwidth in the order of 20 k HZ, said method comprising:
   generating a code signal representing the sequence of code symbols and having frequency components essentially confined to a preselected signalling band having a bandwidth of about 8800 Hz centered on a frequency of about 6300 Hz;
   continuously frequency analyzing said audio signal over a frequency band encompassing said signalling band; dynamically filtering said code signal as a function of said analysis thereby to provide a modified code signal with frequency component levels which are, at each time instant, essentially negligibly small outside said signalling band and, at each frequency within said signalling band, essentially a preselected proportion of the levels of the audio signal frequency components in a corresponding frequency range, said preselected proportion representing a modified code signal level which is about 19 dB below the level of said audio signal;
   combining said modified code signal with said audio signal thereby to provide a composite audio signal and transmitting said composite audio signal over said channel;
   continuously frequency analyzing the received composite audio signal over a frequency band encompassing said preselected signalling band;
   within said signalling band, filtering said received composite audio signal as a converse function of the analysis thereby to provide an essentially even energy distribution over said signalling band; and
   applying said filtered signal to a set of filters, each filter in said set being matched to one of said code symbols.

12. The method as set forth in claim 11 wherein said code signal is generated by generating a corresponding pseudorandom number sequence for each symbol input; upsampling and lowpass filtering said sequence; and transposing upwards in frequency the filtered sequence.

13. A method of communicating code symbols over a channel carrying an audio signal, said method comprising:
   for each symbol input, generating a corresponding pseudorandom sequence baseband signal representing the respective symbol; filtering and transposing upward in frequency said pseudorandom sequences thereby to generate a code signal having frequency components essentially confined to a preselected signalling band lying within the bandwidth of said audio signal;
   continuously frequency analyzing said audio signal over a frequency band encompassing said signalling band;
   dynamically filtering said code signal as a function of said analysis thereby to provide a modified code signal with frequency component levels which are, at each time instant and at each frequency within said signalling band, essentially a preselected proportion of the levels of the audio signal frequency components in a corresponding frequency range;
   combining said modified code signal with said audio signal thereby to provide a composite audio signal and transmitting said composite audio signal over said channel;
   continuously frequency analyzing the received composite audio signal over a frequency band encompassing said preselected signalling band;
   within said signalling band, filtering said received composite audio signal as a converse function of the analysis thereby to provide an essentially even energy distribution over said signalling band;
   transposing components in said signalling band downward in frequency to obtain a received baseband signal; and
   applying said received baseband signal to a set of filters, each filter in said set being matched to one of the pseudorandom sequences representing symbols.

14. Apparatus for combining a sequence of code symbols with an audio signal, said apparatus comprising:
   means for generating a corresponding code signal representing the sequence of code symbols, said code signal comprising frequency components essentially confined to a preselected signalling band lying within the bandwidth of said audio signal;
   means for continuously frequency analyzing said audio signal over a frequency band encompassing said signalling band;
   dynamic filter means for selectively filtering said code signal as a function of said analysis thereby to provide a modified code signal with frequency component levels which are, at each time instant, essentially negligibly small outside said signalling band and, at each frequency within said signalling band, are essentially a preselected proportion of the levels of the audio signal frequency components in a corresponding frequency range; and means for combining said modified code signal with said audio signal thereby to provide a composite audio signal.

15. Apparatus as set forth in claim 14 wherein said audio signal has a bandwidth in the order of about 20 k Hz and said signalling band has a bandwidth of about 8800 Hz.

16. Apparatus as set forth in claim 15 wherein said signalling band is centered on a frequency of about 6300 Hz.

17. Apparatus as set forth in claim 16 wherein said symbols are sequentially encoded in said code signal at a rate of about 4.3 symbols per second.

18. Apparatus as set forth in claim 14 wherein said preselected proportion represents a modified code signal level which is about 19 dB below the level of the audio signal.

19. Apparatus for extracting a sequence of code symbols which are represented by respective pseudorandom sequences embedded in a composite audio signal, said apparatus comprising:

means for continuously frequency analyzing said composite audio signal over a frequency band encompassing a preselected signalling band lying within the bandwidth of the composite audio signal;

dynamic filtering means for selectively filtering said composite audio signal within said signalling band as a converse function of said analysis thereby to provide a modified audio signal having an essentially even energy distribution over said signalling band; and a set of matched filters responsive to said modified signal, each filter in said set being matched to one of the pseudorandom sequences representing said symbols.

20. Apparatus for combining a sequence of code symbols occurring at a rate of about 4.3 per second with an audio signal having a bandwidth in the order of 20 k HZ, said apparatus comprising:

means for generating a corresponding code signal representing the sequence of code symbols, said code signal comprising frequency components essentially confined to a preselected signalling band having a bandwidth of about 8800 Hz centered on a frequency of about 6300 Hz;

means for continuously frequency analyzing said audio signal over a frequency band encompassing said signalling band;

dynamic filter means for selectively filtering said code signal as a function of said analysis thereby to provide a modified code signal with frequency component levels which are, at each time instant, essentially negligibly small outside said signalling band and, at each frequency within said signalling band, are essentially a preselected proportion of the levels of the audio signal frequency components in a corresponding frequency range, said preselected proportion representing a modified code signal level which is about 19 dB below the level of said audio signal; and means for combining said modified code signal with said audio signal thereby to provide a composite audio signal.

21. Apparatus for combining a sequence of code symbols with an audio signal, said apparatus comprising:

means for generating a corresponding binary code sequence representing each successive symbol;

means for filtering and transposing information bearing frequency components of said code sequences thereby to generate a code signal having frequency components essentially confined to a preselected signalling band lying within the bandwidth of said audio signal;

means for continuously frequency analyzing said audio signal over a frequency band encompassing said signalling band;

dynamic filter means for selectively filtering said code signal as a function of said analysis thereby to provide a modified code signal with frequency component levels which are, at each time instant, essentially a preselected proportion of the levels of the audio signal frequency components in a corresponding frequency range;

means for combining said modified code signal with said audio signal thereby to provide a composite audio signal.

22. The apparatus as set forth in claim 21 wherein said code signal is generated by generating a corresponding pseudorandom sequence for each symbol input; low pass filtering said sequences; and transposing upwards in frequency the information bearing components of the filtered sequence.

23. An audio recording comprising a medium carrying a composite signal which is a mixture of an audio signal and a dynamically modified code signal representing a sequence of code symbols wherein said dynamically modified code signal is obtained by:

generating a code signal representing the sequence of symbols with frequency components essentially confined to a preselected signalling band lying within the bandwidth of said audio signal;

continuously frequency analyzing said audio signal over a frequency band encompassing said signalling band;

dynamically filtering said code signal as a function of said analysis thereby to provide a modified code signal with frequency component levels which are, at each time instant, essentially negligibly small outside said signalling band and, at each frequency within said signalling band, are essentially a preselected proportion of the levels of the audio signal frequency components in a corresponding frequency range;

combining said modified code signal with said audio signal thereby to provide a composite audio signal.

24. An audio recording comprising a medium carrying a composite signal which is a mixture of an audio signal having a bandwidth in the order of 20 k Hz and a dynamically modified code signal representing a sequence of code symbols wherein said dynamically modified code signal is obtained by:

generating a corresponding code signal representing the sequence of code symbols with frequency components essentially confined to a preselected signalling band having a bandwidth of about 8800 Hz centered on a frequency of about 6300 Hz;

continuously frequency analyzing said audio signal over a frequency band encompassing said signalling band;

dynamically filtering said code signal as a function of said analysis thereby to provide a modified code signal with frequency component levels which are, at each time instant, essentially negligibly small outside said signalling band and, at each frequency within said signalling band, are essentially a preselected proportion of the levels of the audio signal frequency components in a corresponding frequency range, said preselected proportion representing a modified code signal level which is about 19 dB below the level of said audio signal;

combining said modified code signal with said audio signal thereby to provide a composite audio signal.

25. The recording as set forth in claim 24 wherein said code signal is generated by generating a corresponding pseudorandom number sequence for each symbol input; upsampling and lowpass filtering said sequences; and transposing upwards in frequency the filtered sequence.

* * * * *